(12) United States Patent
Cacho Alonso

(10) Patent No.: US 9,968,013 B2
(45) Date of Patent: May 8, 2018

(54) COOLING ARRANGEMENT FOR COMPONENTS DISPOSED IN AN INTERIOR OF A SWITCH CABINET

(71) Applicant: RITTAL GMBH & CO. KG, Herborn (DE)

(72) Inventor: Juan Carlos Cacho Alonso, Herborn (DE)

(73) Assignee: Rittal GmbH & Co. KG, Herborn (DE)

( * ) Notice: Subject to any disclaimer, the term of this patent is extended or adjusted under 35 U.S.C. 154(b) by 262 days.

(21) Appl. No.: 14/392,022

(22) PCT Filed: Aug. 8, 2013

(86) PCT No.: PCT/DE2013/100286
§ 371 (c)(1),
(2) Date: Feb. 19, 2015

(87) PCT Pub. No.: WO2014/032649
PCT Pub. Date: Mar. 6, 2014

(65) Prior Publication Data
US 2015/0296665 A1 Oct. 15, 2015

(30) Foreign Application Priority Data

Aug. 31, 2012 (DE) .................. 10 2012 108 110

(51) Int. Cl.
*F25D 17/00* (2006.01)
*H05K 7/20* (2006.01)
*F28D 15/02* (2006.01)

(52) U.S. Cl.
CPC ......... *H05K 7/20936* (2013.01); *F28D 15/02* (2013.01); *F28D 15/0275* (2013.01); *H05K 7/206* (2013.01); *H05K 7/20609* (2013.01); *H05K 7/20627* (2013.01); *H05K 7/20663* (2013.01)

(58) Field of Classification Search
CPC ............................ F25B 25/005; F25D 11/025
USPC .......................................... 62/333, 332, 335
See application file for complete search history.

(56) References Cited

U.S. PATENT DOCUMENTS

| | | | |
|---|---|---|---|
| 5,058,391 A | 10/1991 | Periot | |
| 6,796,372 B2 | 9/2004 | Bear | |
| 6,828,675 B2 | 12/2004 | Memory et al. | |
| 8,305,754 B2 | 11/2012 | Wu et al. | |
| 2003/0057546 A1 | 3/2003 | Memory et al. | |
| 2008/0164010 A1* | 7/2008 | Kang | F28D 15/0266 165/104.26 |
| 2012/0103571 A1 | 5/2012 | Wu et al. | |
| 2013/0037253 A1 | 2/2013 | Schneider et al. | |

FOREIGN PATENT DOCUMENTS

| | | |
|---|---|---|
| DE | 69005701 T2 | 4/1994 |
| DE | 10296928 T5 | 10/2004 |
| DE | 102010009776 A1 | 9/2011 |

* cited by examiner

Primary Examiner — Melvin Jones
(74) Attorney, Agent, or Firm — Marshall & Melhorn, LLC

(57) ABSTRACT

The invention relates to a switch cabinet with a cooling apparatus which has a first closed coolant circuit and a second closed coolant circuit separated fluidically from the first coolant circuit, the first coolant circuit having a refrigerating machine or a cold water set and the second coolant circuit having a heat pipe arrangement.

7 Claims, 8 Drawing Sheets

COOLING ARRANGEMENT FOR COMPONENTS DISPOSED IN AN INTERIOR OF A SWITCH CABINET

BACKGROUND OF THE INVENTION

The invention relates to a cooling arrangement for components disposed in an interior of a switch cabinet, having a switch cabinet and a cooling apparatus which has a first closed coolant circuit and a second coolant circuit separated fluidically therefrom, the first coolant circuit having a refrigerating machine or a cold water set and the second coolant circuit having a heat pipe arrangement or a two-phase thermosiphon. A cooling arrangement of this type is known from DE 102 96 928 T5. DE 690 05 701 T2, US 2003/0057546 A1 and US 2012/0103571 A1 likewise in each case describe a similar arrangement.

Such cooling apparatuses often comprise a refrigerating machine, in which a compressor, a condenser, an expansion means and an evaporator are arranged one behind the other in the coolant flow direction in a coolant circuit. The refrigerating machine is designed, in principle, for providing sufficient cooling of the switch cabinet interior under extreme conditions, that is to say at maximum ambient temperatures and at the same time maximum power dissipations of the components accommodated in the switch cabinet. However, since these extreme conditions are prevalent only in exceptional cases, the refrigerating machine is most of the time in on/off operation, that is to say in an energy-inefficient operating mode.

Furthermore, refrigerating machines have the disadvantage of having comparatively high energy consumption. It is therefore desirable, in principle, to provide at least a proportion of the required cooling capacity with the aid of alternative cooling techniques. For this purpose, cooling apparatuses are known from the prior art which combine an air/air heat exchanger with a refrigerating machine, so that, when there is a sufficiently large temperature difference between the switch cabinet desired temperature and the ambient air temperature of the switch cabinet, the required cooling capacity can be provided solely or at least as far as possible with the aid of the air/air heat exchanger. Such combined cooling apparatuses are also designated later on in the application as "hybrid cooling apparatuses". Hybrid cooling apparatuses which have an air/air heat exchanger have the disadvantage that, in the event that the ambient air temperature lies above the switch cabinet temperature, heating of the switch cabinet would take place if warm ambient air were to continue to flow through the air/air heat exchanger, and therefore, in the cooling apparatuses known from the prior art, a complicated flat valve mechanism is provided for diverting the ambient air from the heat exchanger in the situation referred to. However, these mechanisms involve a high outlay and are complicated to handle.

In general, cooling circuits having a refrigerating machine or a cold water set which introduce cold into the system and serve as a rule for cooling a cooling medium are designated as "active" cooling circuits. The cold water set may in the simplest case have a cold water reservoir, and in this context a person skilled in the art will understand that "water" in cooling applications is not to be interpreted restrictively, but is used merely as a synonym for the coolants or refrigerants, generally designated as "cooling medium", which are known from the prior art. Correspondingly, "passive" cooling circuits have no refrigerating machine and no cold water set. Active cooling of a cooling medium does not take place in these.

SUMMARY OF THE INVENTION

The object of the invention, therefore, is to provide a generic switch cabinet having a cooling apparatus, in which the cooling apparatus is designed by simple technical means and, for low temperature differences between the switch cabinet desired temperature and the ambient air temperature of the switch cabinet, can also be operated passively, that is to say without the use of a refrigerating machine or of a cold water set.

This object is achieved, according to the invention, by means of a switch cabinet having the features of claim 1. The dependent claims 2 to 6 refer in each case to advantageous embodiments of the invention.

According to the invention, the cooling apparatus has a first air passage with a first air inlet and a first air outlet, which are open to the surroundings of the switch cabinet, and a second air passage with a second air inlet and a second air outlet which are open to the interior of the switch cabinet, a condensation zone of the heat pipe arrangement being disposed in the first air passage and an evaporation zone of the heat pipe arrangement being disposed in the second air passage, and the condensation zone and the evaporation zone having in each case an air/coolant heat exchanger.

Preferably, the heat pipe arrangement comprises a gravity heat pipe, the evaporation zone being disposed above the condensation zone. Correspondingly, the first and the second air passage should, at least in regions, be disposed with respect to one another in such a way that the condensation zone is disposed at least partially above the evaporation zone.

Furthermore, a condenser of the refrigerating machine or an air/water heat exchanger of the cold water set is disposed in the first air passage, and an evaporator of the refrigerating machine or an air/water heat exchanger of the cold water set is disposed in the second air passage.

In order to increase the efficiency of the cooling apparatus according to the invention, in one embodiment of the invention there is provision whereby the condenser of the refrigerating machine is disposed downstream of the condensation zone of the heat pipe arrangement in the air flow direction through the first air passage, and the evaporator of the refrigerating machine is disposed downstream of the evaporation zone of the heat pipe arrangement in the air flow direction through the second air passage.

For the same purpose, in a cooling apparatus which combines a heat pipe arrangement with a cold water set, there may be provision whereby the air/water heat exchanger of the cold water set is disposed downstream of the condensation zone of the heat pipe arrangement in the air flow direction through the first air passage or downstream of the evaporation zone of the heat pipe arrangement in the air flow direction through the second air passage.

In order to achieve an especially compact type of construction of the first and of the second coolant circuit and in order to achieve heat exchange between the first and the second coolant circuit via the air/coolant heat exchanger of the evaporation zone, in one embodiment of the invention there is provision whereby the air/coolant heat exchanger of the evaporation zone has a first line system for a first coolant and a second line system, separated fluidically from the first line system, for a second coolant, the first and the second line system being coupled thermally to one another, and the first line system being an integral part of the first coolant circuit and the second line system being an integral part of the second coolant circuit.

In this case, the first line system of the air/coolant heat exchanger of the evaporation zone may have or form an evaporator of the refrigerating machine or an air/water heat exchanger of the cold water set.

Alternatively or additionally, the air/coolant heat exchanger of the condensation zone may similarly have a first line system for a first coolant and a second line system, separated fluidically from the first line system, for a second coolant, the first and the second line system being coupled thermally to one another, and the first line system being an integral part of the first coolant circuit and the second line system being an integral part of the second coolant circuit.

Likewise, in the last-mentioned embodiment, the first line system of the air/coolant heat exchanger of the condensation zone may have or form a condenser of the refrigerating machine or an air/water heat exchanger of the cold water set.

BRIEF DESCRIPTION OF THE DRAWINGS

Further details of the invention are explained with reference to the following figures in which.

DETAILED DESCRIPTION OF THE INVENTION

Figure 1:
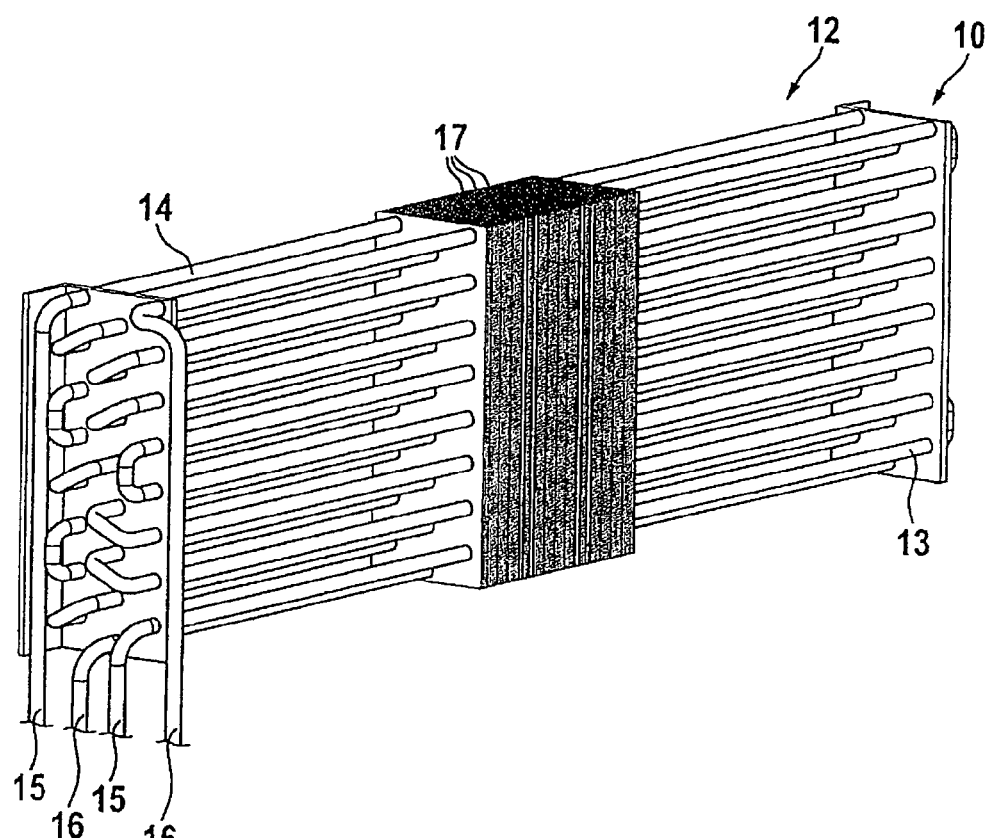
FIG. 1 shows a heat exchanger with two thermally coupled line systems separated fluidically from one another.

In the embodiment, illustrated in FIG. 1, of an air/coolant heat exchanger 10 of the second coolant circuit, this is formed in one piece with an evaporator or an air/water heat exchanger 12 of the first coolant circuit. The heat exchanger 10 has a first line system 13, in which a first coolant of the first coolant circuit is routed, and a second line system 14, in which a second coolant of the second coolant circuit is routed. The line systems 13, 14 are composed in each case of parallel pipe paths which extend between two longitudinal ends of the heat exchanger 10. The parallel pipelines are connected to one another at the longitudinal ends in such a way that the coolant is routed between a respective coolant forward flow 15 and a coolant return flow 16. The heat exchanger 10 illustrated in FIG. 1 is designed for a gas, for example, air, to flow through its longitudinal sides, vertical in the illustration. The heat exchanger 10 has a plurality of lamellae 17, adjacent lamellae 17 forming between them in each case an air flow duct through the heat exchanger. Furthermore, the lamellae 17 have the task of coupling the first and the second line system 13, 14 thermally to one another for heat exchange. In the above-described flow direction of the air flowing through the heat exchanger 10, the first and the second line system 13, 14 are disposed one behind the other in the air flow direction. If the first line system 13 is an integral part of a cooling circuit having a refrigerating machine or a cold water set and the second line system 14 is an integral part of a cooling circuit having a heat pipe arrangement, and there is furthermore provision whereby the cooling of the air flowing through the heat exchanger 10 preferably takes place via the heat pipe arrangement, there may be provision whereby the refrigerating machine or the cold water set is put into operation only when the cooling capacity provided via the heat pipe arrangement is not sufficient. Since the two cooling circuits 13, 14 are designed to be independent of one another, it is not necessary for the heat pipe arrangement to be deactivated in order to switch on the refrigerating machine or the cold water set. When the active cooling circuit is inoperative and cooling is therefore to take place via the passive cooling circuit, the pipelines of the line system 13 of the active cooling circuit in the first heat exchanger 10 serve for increasing the cooling capacity of the line system 14 of the passive cooling circuit on account of the heat coupling implemented with the aid of the lamellae 17. Thus, even when the active cooling circuit is inoperative, its line system 13 in the heat exchanger 10 is not useless; Instead, it serves in this case to increase the efficiency of the passive cooling circuit.

Figure 2:
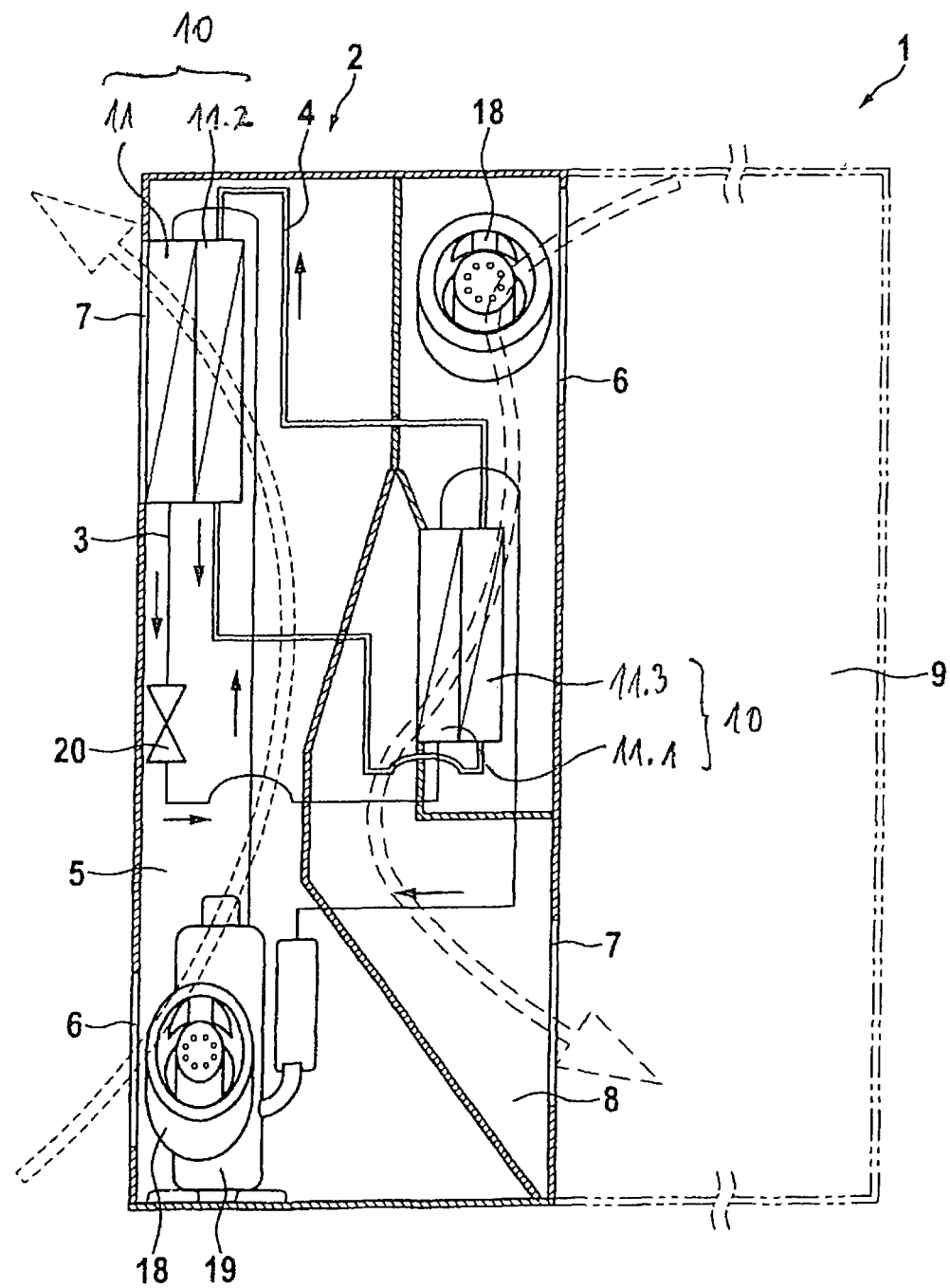
FIG. 2 shows a cooling arrangement according to the invention with a cooling apparatus designed as a wall-mounted unit and having a refrigerating machine and a heat pipe arrangement.

FIG. 2 shows a switch cabinet 1 in which the cooling apparatus 2 is designed as a wall-mounted cooling unit. The switch cabinet 1 comprises a switch cabinet interior 9, the cooling apparatus 2 being attached to an outer wall of the switch cabinet 1, and the interior 9 of the switch cabinet 1 being connected fluidically to the second air passage 8 of the cooling apparatus 2 via an air inlet 6 and an air outlet 7. The air received in the switch cabinet 1 is transported through the second air passage 8 with the aid of the fan 18. A second heat exchanger 10 according to the invention, as shown in FIG. 1, is disposed in the second air passage 8. The heat exchanger in the second air passage 8 has an evaporator 11.1 and an evaporation zone 11.3 of a heat pipe arrangement, the evaporation zone 11.3 preceding the evaporator 11.1 in the air flow direction through the second air passage 8. The cooling apparatus 2 has, separated fluidically from the second air passage 8, a first air passage 5 which is connected fluidically to the surroundings of the switch cabinet 1 via an air inlet 6 and an air outlet 7. A fan 18 again serves for transporting ambient air into the first air passage 5 of the cooling apparatus 2 via the inlet 6. Disposed in the first air passage 5 is a first heat exchanger 10 according to the invention, as shown in FIG. 1, through which the air routed through the first air passage 5 flows. The heat exchanger in the first air passage 5 has a condenser 11 and a condensation zone 11.2 of a heat pipe arrangement, the condensation zone 11.2 preceding the condenser 11.1 in the air flow direction through the first air passage 5. The heat exchangers 10 are connected fluidically to one another in such a way that the first line system 13 of the first heat exchanger 10 forms a first closed coolant circuit 3 with the first line system 13 of the second heat exchanger 10, and the second line system 14 of the first heat exchanger 10 forms a second closed coolant circuit 4 with the second line system 14 of the second heat exchanger 10.

In the embodiment according to FIG. 2, the first closed coolant circuit 3 is a compressor-driven coolant circuit with a compressor 19 and an expansion valve 20. Consequently, the first heat exchanger 10, in so far as it relates to the first closed coolant circuit 3, has the function of a condenser and the second heat exchanger 10, in so far as it relates to the first closed coolant circuit 3, has the function of an evaporator.

The second closed coolant circuit 4 forms a heat pipe. For this purpose, the first heat exchanger 10 is disposed above the second heat exchanger 10. The second closed coolant circuit 4 is filled at least partially with a coolant. Coolants suitable for heat pipe applications are known from the prior art and may comprise water. The liquid coolant settles as a consequence of gravity in the lower region of the second closed coolant circuit 4, where the evaporation zone of the heat pipe is located. It is this evaporation zone which forms the second heat exchanger 10. Warm switch cabinet air transported through the second air passage 8 flows through the second heat exchanger 10. At the same time, the coolant of the second closed coolant circuit 4 heats up, whereupon it evaporates at least partially. The evaporating coolant rises into the first heat exchanger 10 which in fact forms the condensation zone of the heat pipe. The first heat exchanger 10 is cooled by the cool ambient air of the switch cabinet 1 which is transported through the first air passage 5 with the aid of the fan 18, whereupon the gaseous coolant in the first heat exchanger 10 condenses. The condensed coolant, driven by gravity, travels out of the first heat exchanger 10 back into the lower-lying second heat exchanger 10 and can evaporate anew there and rise once again into the second heat exchanger 10.

The cooling apparatus 2 according to FIG. 2 can thus be operated selectively in three different cooling modes, to be precise solely active, solely passive or hybrid, and in hybrid operation there may be provision, in particular, whereby the passive cooling process is operated permanently, while the active cooling process serves for supplementing the cooling capacity provided with the aid of the passive cooling process, to an extent such that, in total, at least the required cooling capacity is made available, for which purpose the active cooling process is clocked.

FIGS. 3 to 6 illustrate that essentially one and the same cooling apparatus set-up can serve for implementing a multiplicity of different cooling processes.

Figure 3:
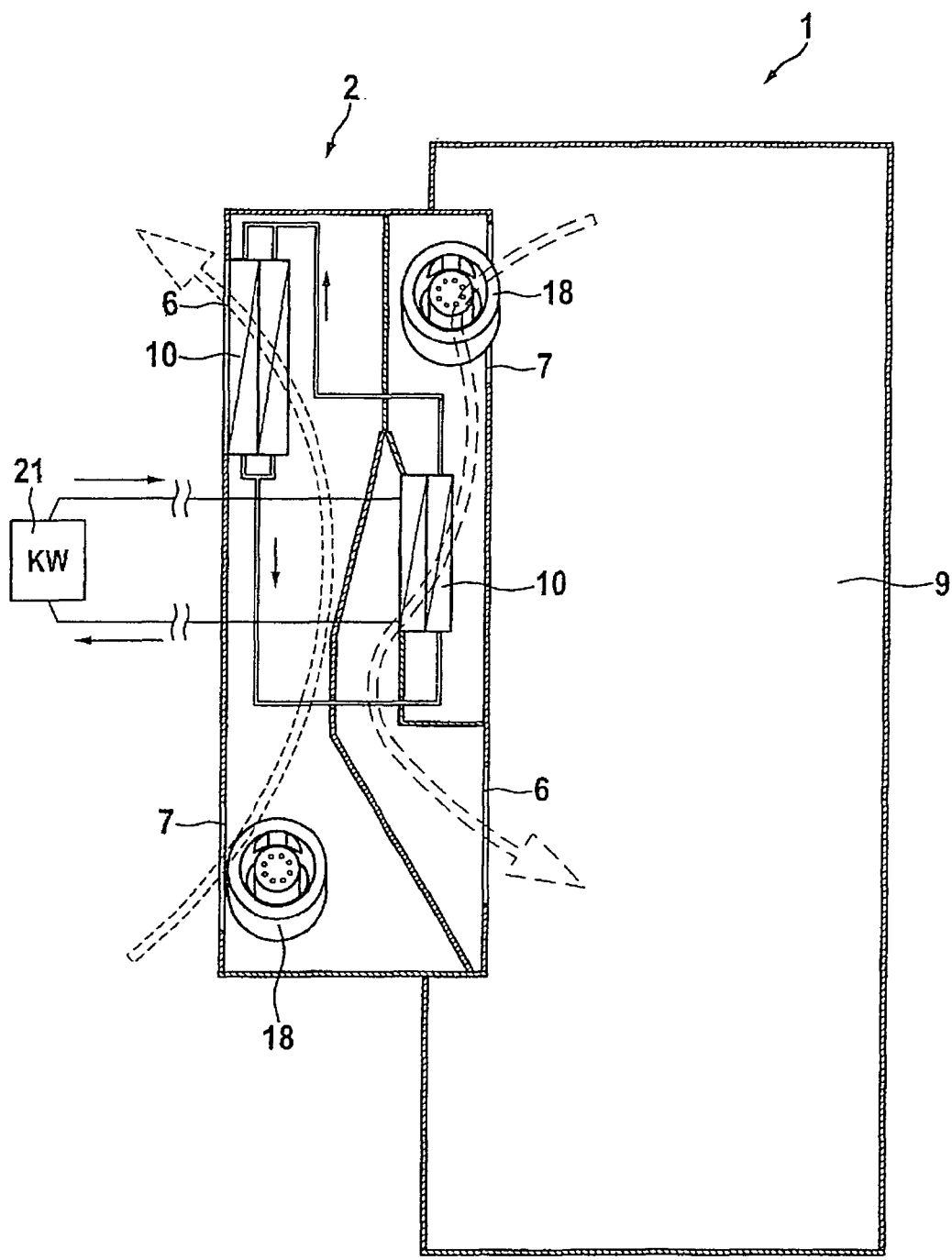
FIG. 3 shows a cooling arrangement according to the invention with a cooling apparatus designed as a wall-mounted unit and having a cold water set in the inner circuit.
Figure 4:
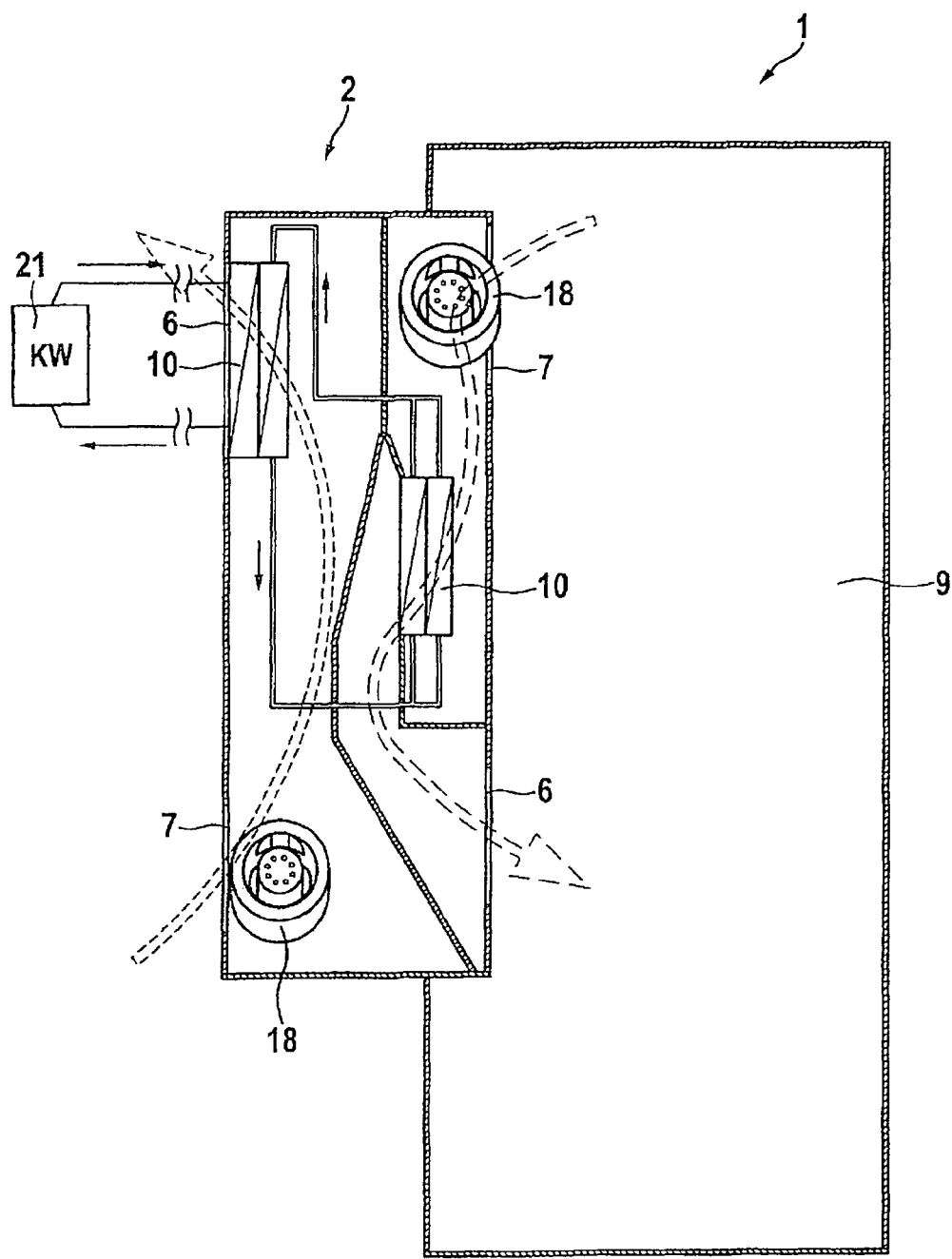
FIG. 4 shows a cooling arrangement according to the invention with a cooling apparatus designed as a wall-mounted unit and having a cold water set in the outer circuit.
Figure 5:
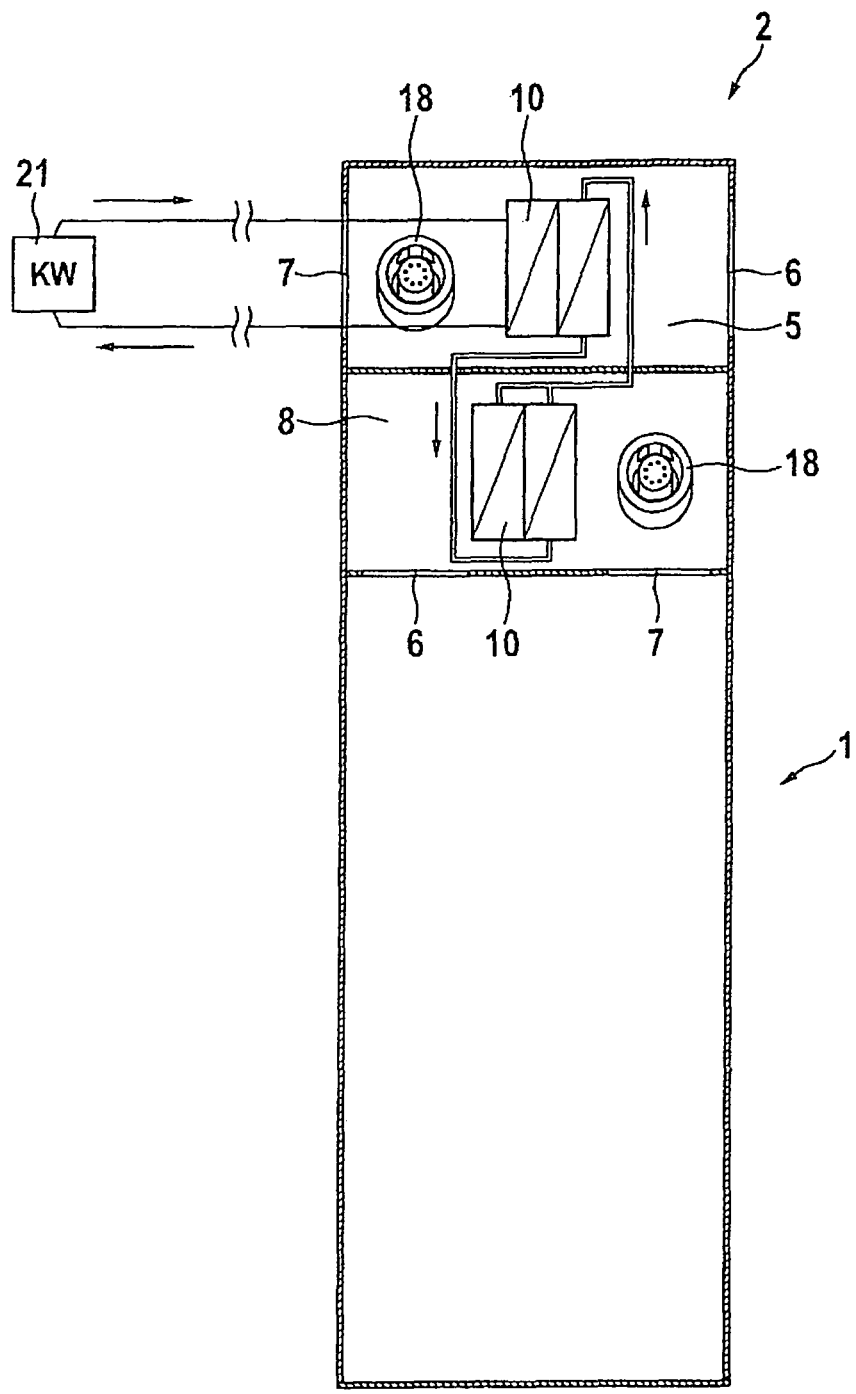
FIG. 5 shows a cooling arrangement according to the invention with a cooling apparatus designed as a roof-mounted unit and having a cold water set in the inner circuit.
Figure 6:
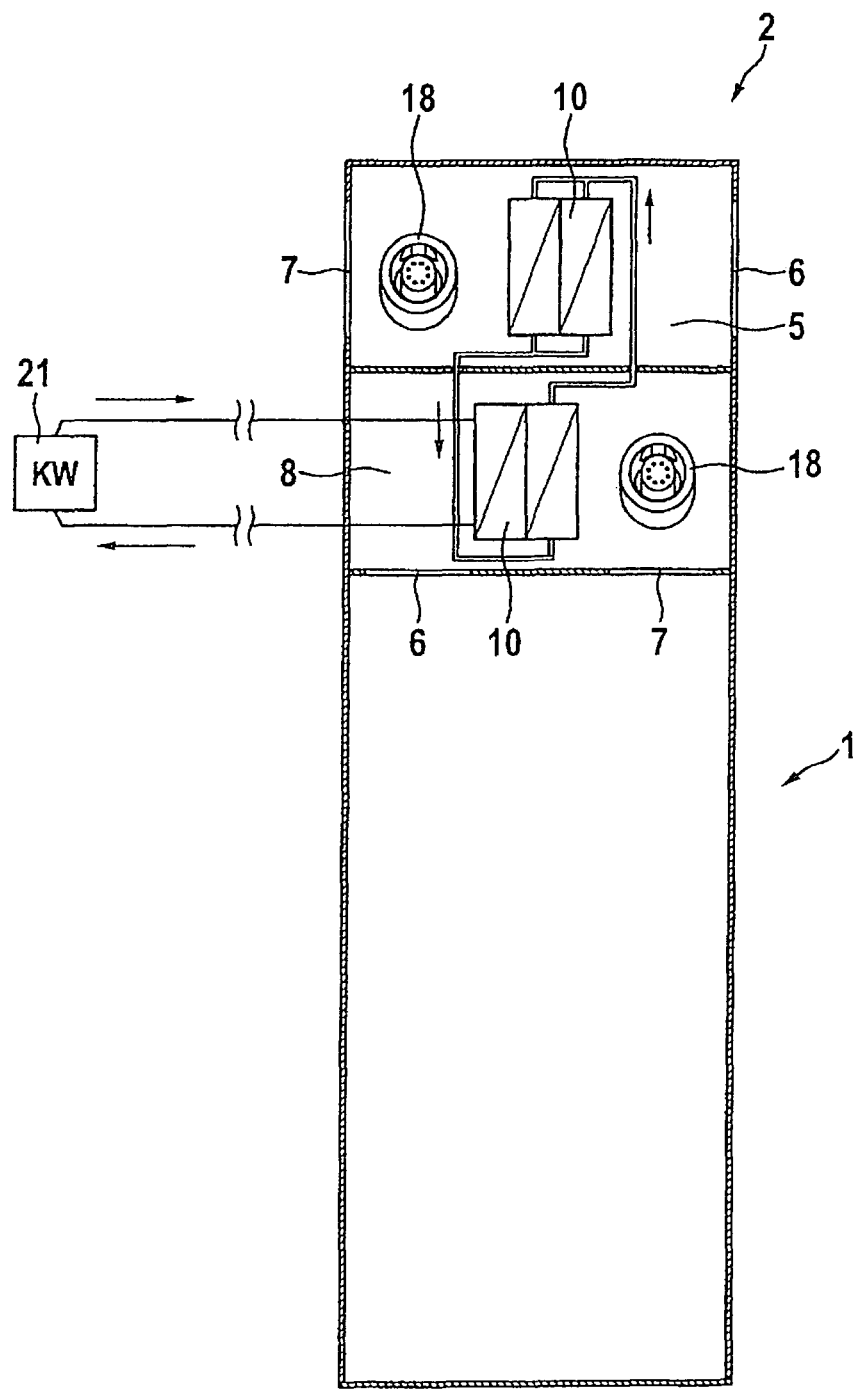
FIG. 6 shows a cooling arrangement according to the invention with a cooling apparatus designed as a roof-mounted unit and having a cold water set in the inner circuit.

In this case, the embodiments according to FIGS. 3 and 4 relate to wall cooling apparatuses and the embodiments according to FIGS. 5 and 6 to cooling apparatuses which are designed as roof mountings.

FIG. 3 shows a hybrid cooling apparatus With a cold water set in the inner circuit. The first and the second line system 13, 14 of the first heat exchanger 10 in the first air passage 5 are connected in series, these forming with the second line system 14 of the second heat exchanger 10 a heat pipe. The remaining second line system 14 of the second heat exchanger 10 forms with a cold water source 21 the second closed coolant circuit 4 and consequently a cold water set. The cold water source 21 provides cooled water which is circulated through the second heat exchanger 10 and is not an integral part of the cooling apparatus 2. This additional active coolant circuit 4 can thus serve for making available, either in the case of high power dissipations of the components accommodated in the switch cabinet interior 9 or in the case of high ambient temperatures of the switch cabinet 1, an additional cooling capacity which supplements the cooling capacity provided with the aid of the passive cooling circuit 3, to an extent such that, in total, sufficient switch cabinet cooling is made available.

Particularly in the case of high ambient temperatures, it may be expedient according to the set-up, as shown in FIG. 4, to implement the additional active coolant circuit 4 with the aid of the heat exchanger 10 integrated into the second air passage 8. Here, once again, the active coolant circuit comprises a cold water set.

FIGS. 5 and 6 show that cooling apparatuses 2 for the roof mounting, which have the high variability according to the invention, can be implemented in a similar way to FIGS. 3 and 4. Even in the case of cooling apparatuses which are implemented as roof mountings, the user is free to implement the active coolant circuit 4, in addition to the passive coolant circuit 3, either in the outer circuit via the first heat exchanger 10 (see FIG. 5) or in the inner circuit via the second heat exchanger 10 (see FIG. 6).

Figure 7:
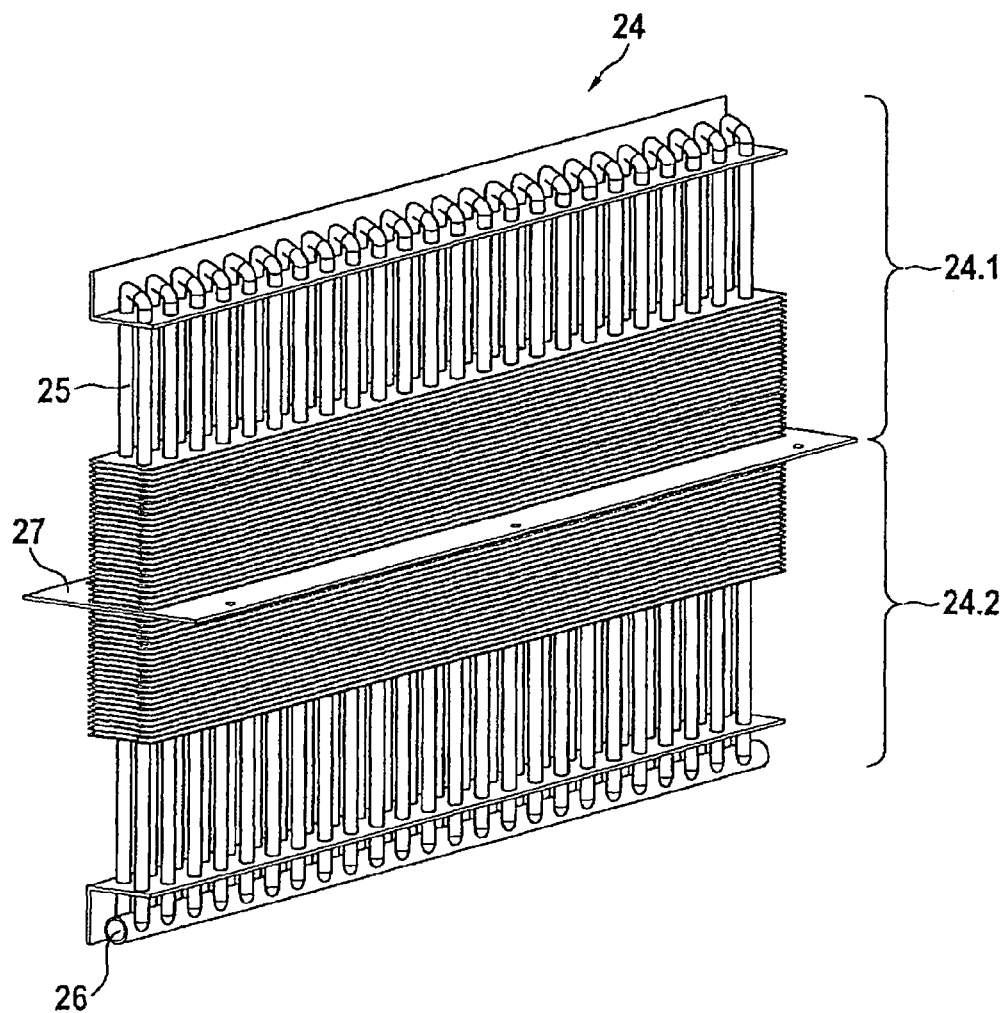
FIG. 7 shows a heat pipe arrangement for use in a cooling apparatus according to FIGS. 5 and 6 designed as a roof-mounted unit.

FIG. 7 shows an exemplary embodiment of a heat pipe arrangement, such as may be used, in particular, in roof-mounted cooling apparatuses.

The heat pipe arrangement 24 comprises a line system which is composed of vertically routed pipe sections 25. The pipe sections 25 are composed in each case of pairs of parallel pipelines which are connected fluidically to one another at their upper end with the aid of a U-shaped deflection piece. At the lower end of each pipe section 25, the pipelines of each pipe section 25 issue into a common header 26 which connects the pipe sections 25 fluidically to one another. The heat pipe arrangement 24 is subdivided via a horizontally extending end lamella 27 into a condensation zone 24.1 and an evaporation zone 24.2, and, with the air/air heat exchanger 10 fitted, the condensation zone 24.1 is disposed in the first air passage of the cooling apparatus and the evaporation zone 24.2 is disposed in the second air passage of the cooling apparatus. The end lamella 27 serves for positioning and fastening the heat pipe arrangement 24 at a leadthrough formed in an intermediate wall which separates the first air passage from the second air passage. The pipelines of the pipe sections 25 are led through horizontally extending, thermally conductive lamellae 17 and are coupled thermally to these, an air guide slot being formed in each case between adjacent lamellae 17. The lamellae 17 therefore extend precisely in the direction of movement of the air transported through the first air passage or of the air transported through the second air passage and serve for improving heat exchange between the evaporation zone 24.2 or condensation zone 24.1 and the air routed through the respective air passage.

A refrigerant is held in reserve in the line system of the heat pipe arrangement 24 and, driven by gravity because of the vertical orientation of the pipe sections 25, accumulates, above all, in the lower region of the heat pipe arrangement 24 and consequently in the header 26 and also in the evaporation zone 24.2. According to the invention, the evaporation zone 24.2 is disposed precisely in the second air passage 8 of the cooling apparatus and consequently has flowing through it the warm air from the switch cabinet interior 9. The warm air can transfer heat via the pipelines or the thermally conductive lamellae 17 to the coolant which is located in the evaporation zone 24.2 and which thereupon changes from the liquid state of aggregation to the gaseous state of aggregation and travels along the pipelines into the condensation zone 24.1 of the heat pipe arrangement 24. According to the invention, the condensation zone 24.1 is to be located precisely in the first air passage 5 of the cooling apparatus 2, so that the cool ambient air of the switch cabinet 1 flows precisely around said condensation zone. The result of this is that the gaseous refrigerant which is held in reserve in the condensation zone 24.1 of the heat pipe arrangement 24 can transfer heat energy to the ambient air transported through the first air passage 3, whereupon this ambient air condenses and, driven by gravity, flows out of the condensation zone 24.1 back into the evaporation zone 24.2.

It is evident that the line system and, in particular, its pipe sections do not have to be oriented exactly vertically to ensure that the above-described functionality can be achieved. On the contrary, an angled arrangement of the heat pipe arrangement 24 in the cooling apparatus may also be envisaged, for example in order to achieve a space-saving cooling apparatus of lower build.

Figure 8:
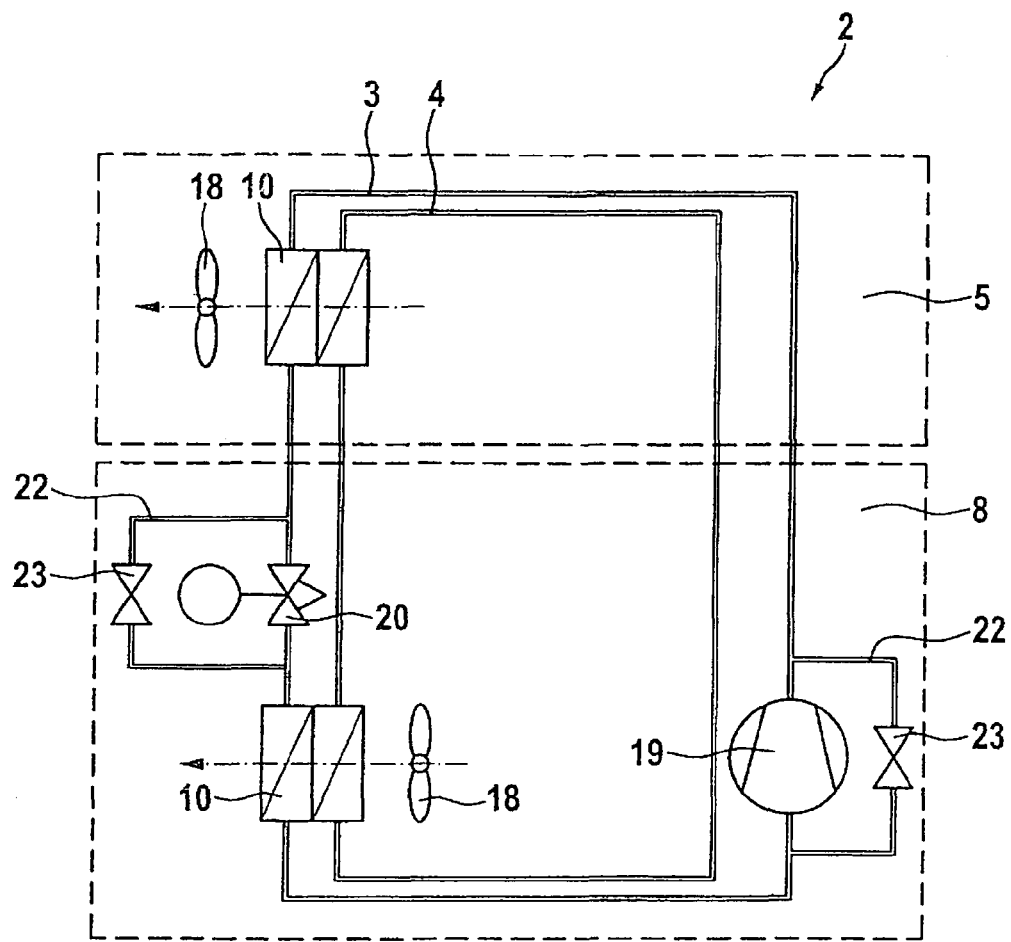
FIG. 8 shows a cooling apparatus according to the invention in which an expansion means and a compressor of the refrigerating machine of the first coolant circuit can be selectively bridged.

FIG. 8 describes diagrammatically an alternative embodiment of the hybrid cooling apparatus 2 according to the invention, with a first and a second heat exchanger 10 according to the invention which couple a first closed coolant circuit 3 and a second closed coolant circuit 4 thermally to one another. The first closed coolant circuit 3 is an active coolant circuit which has, one behind the other in the coolant flow direction, a compressor 19, a condenser in the form of the upper heat exchanger 10, an expansion valve 20 and an evaporator in the form of the lower heat exchanger 10. The compressor 19 and the expansion valve 20 are bridged via a bypass line 22 which has in each case a valve 23. In the closing position of the valves 23, the first closed coolant circuit 3 can be operated actively. When the valves 23 are opened, the heat exchangers 10 form a heat pipe arrangement and therefore a passive coolant circuit. The two coolant circuits 3, 4 are disposed with respect to one another in such a way that the respective refrigerants are transported in the opposite direction to one another when the first coolant circuit 3 is operated actively. In the second coolant circuit 4, a second coolant is routed between the evaporator and the condenser. The condenser and the evaporator are in each case configured in such a way that the two coolant circuits 3, 4 are coupled thermally to one another via the evaporator and the condenser. The condenser is disposed at a vertical distance above the evaporator. The condenser is disposed in a first air passage 5, formed by a first subhousing of the cooling apparatus, of the cooling apparatus 2, and the evaporator and also the compressor 19 and the expansion valve 20 are disposed in a second air passage 8 formed by a second subhousing of the cooling apparatus 2. Ambient air of the switch cabinet 1 is transported with the aid of a fan 18 through the first air passage 5 and, in particular, the condenser. Heated air from the switch cabinet interior is transported with the aid of a further fan 18 through the second air passage 8 and, in particular, the evaporator. The valves 23 in the bypass lines 22 are preferably electrically activatable solenoid valves.

The second coolant in the second coolant circuit 4 is heated via the warm switch cabinet air which is transported through the second air passage 8, whereupon said second coolant evaporates at least partially or reduces its density at least to an extent such that it is transported along the second coolant circuit 4 from the evaporator into the condenser. Cool ambient air of the switch cabinet flows around the condenser. The coolant thereby condenses or is compressed in such a way that it flows along the coolant circuit 4 back into the evaporator, in order to be heated anew there by the warm switch cabinet air. If the first coolant circuit 3 is likewise in the passive operating mode, the refrigerant can also circulate in this between the evaporator and the condenser in the way described above with reference to the second coolant circuit 4. In this case, the transport direction of the first coolant in the first coolant circuit 3 is opposite to the depicted flow direction x. The depicted flow direction x of the first coolant in the first coolant circuit 3 corresponds to that which is established during the active operation of the first coolant circuit 3.

The features of the invention which are disclosed in the above description, in the drawing and in the claims may be essential both individually and in any combination for implementing the invention.

LIST OF REFERENCE SYMBOLS

1 Switch cabinet
2 Cooling apparatus
3 First closed coolant circuit
4 Second closed coolant circuit
5 First air passage
6 Air inlet
7 Air outlet
8 Second air passage
9 Interior of the switch cabinet
10 Air/coolant heat exchanger
11 Condenser
11.1 Evaporator
11.2 Condensation zone
11.3 Evaporation zone
12 Air/water heat exchanger
13 First line system
14 Second line system
15 Coolant forward flow
16 Coolant return flow
17 Lamellae
18 Fan
19 Compressor
20 Expansion valve
21 Cold water source
22 Bypass line
23 Valve
24 Heat pipe arrangement
24.1 Condensation zone
24.2 Evaporation zone
25 Vertical pipe sections
26 Header
27 End lamella

The invention claimed is:

1. A cooling arrangement for components disposed in an interior of a switch cabinet, having a switch cabinet and a cooling apparatus which has a first closed coolant circuit and a second coolant circuit separated fluidically therefrom, the first coolant circuit having a refrigerating machine or a cold water set and the second coolant circuit having a heat pipe arrangement, and the cooling apparatus having, furthermore, a first air passage with a first air inlet and a first air outlet, which are open to surroundings of the switch cabinet, and a second air passage with a second air inlet and a second air outlet, which are open to an interior of the switch cabinet, a condenser of the refrigerating machine or an air/water heat exchanger of the cold water set and a condensation zone of the heat pipe arrangement being disposed in the first air passage, and an evaporator of the refrigerating machine or an air/water heat exchanger of the cold water set and an evaporation zone of the heat pipe arrangement being disposed in the second air passage, and the condensation zone and the evaporation zone having in each case an air/coolant heat exchanger.

2. The cooling arrangement as claimed in claim 1, in which the condenser of the refrigerating machine is disposed downstream of the condensation zone of the heat pipe arrangement in the air flow direction through the first air passage, and the evaporator of the refrigerating machine is disposed downstream of the evaporation zone of the heat pipe arrangement in the air flow direction through the second air passage.

3. The cooling arrangement as claimed in claim 1, in which the air/water heat exchanger of the cold water set is disposed downstream of the condensation zone of the heat pipe arrangement in the air flow direction through the first air passage or downstream of the evaporation zone of the heat pipe arrangement in the air flow direction through the second air passage.

4. The cooling arrangement as claimed in claim 1, in which the air/coolant heat exchanger of the evaporation zone has a first line system for a first coolant and a second line system, separated fluidically from the first line system, for a second coolant, the first and the second line system being coupled thermally to one another, and the first line system being an integral part of the first coolant circuit and the second line system being an integral part of the second coolant circuit.

5. The cooling arrangement as claimed in claim 4, in which the first line system of the air/coolant heat exchanger of the evaporation zone has or forms an evaporator of the refrigerating machine or an air/water heat exchanger of the cold water set.

6. The cooling arrangement as claimed in claim 1, in which the air/coolant heat exchanger of the condensation zone has a first line system for a first coolant and a second line system, separated fluidically from the first line system, for a second coolant, the first and the second line system being coupled thermally to one another, and the first line system being an integral part of the first coolant circuit and the second line system being an integral part of the second coolant circuit.

7. The cooling arrangement as claimed in claim 6, in which the first line system of the air/coolant heat exchanger of the condensation zone has or forms a condenser of the refrigerating machine or an air/water heat exchanger of the cold water set.

* * * * *